US006388557B1

(12) United States Patent
Portilla

(10) Patent No.: US 6,388,557 B1
(45) Date of Patent: May 14, 2002

(54) TELECOMMUNICATION SYSTEM FOR REMOTELY CONTROLLING ELECTRONIC DEVICES

(75) Inventor: Gustavo Portilla, Pereira (CO)

(73) Assignee: Digital Esperanto, Inc., Miami, FL (US)

( * ) Notice: Subject to any disclaimer, the term of this patent is extended or adjusted under 35 U.S.C. 154(b) by 0 days.

(21) Appl. No.: 09/227,625

(22) Filed: Jan. 8, 1999

(51) Int. Cl.[7] ................................................ H03K 17/00

(52) U.S. Cl. ......................... 340/2.2; 340/2.1; 370/420; 709/217; 709/219; 709/224

(58) Field of Search ....................... 340/825.44, 825.03, 340/825.07, 286.01, 825.52, 2.2, 2.1; 375/272; 710/3, 8, 9; 370/420; 709/217, 219, 224

(56) References Cited

U.S. PATENT DOCUMENTS 5,784,003 A * 7/1998 Blair .......................... 340/2.2

* cited by examiner

*Primary Examiner*—Brian Zimmerman
*Assistant Examiner*—Yves Dalencourt
(74) *Attorney, Agent, or Firm*—J. Sanchelima

(57) ABSTRACT

An electronic signal communication system for processing remote signals to be conveyed from a subscribed transmitting client to a subscribed receiving client. Several transmitters, each having first and second inputs, are linked with remotely located sets of receivers compatible with the communications links used. A generating signal assembly generates a first signal and a plurality of second signals. The first signal includes control and possibly data information. The second signals enable one of several transmitters. Once received, a detector and selector assembly detects the receiver's active output and conveys the information to a subscribing recipient who in turn has one or more actuating devices controlling the conventional controllable resources of the subscribed recipient.

5 Claims, 2 Drawing Sheets

TELECOMMUNICATION SYSTEM FOR REMOTELY CONTROLLING ELECTRONIC DEVICES

II. BACKGROUND OF THE INVENTION

1. Field of the Invention

The present invention relates to telecommunication systems for remotely controlling devices, and more particularly, to such a system that includes a plurality of telecommunication linkage paths that can be made alternatively available to control resource devices of receiving subscribed clients by transmitting from a centralized service system according to subscribers' requirements.

2. Description of the Related Art

The complexities of today's communications involve the use of many different communication systems with their unique signals. However, the transmitting and receiving parties need to be in alert mode and ready to perfect the connection. If the receiver is not ready to receive, the transmitting party has to alert the user at the receiving end so that the receiving equipment can be turned on and the transmitting and receiving party depend on only one communication linkage. The present invention permits a transmitting client to request from the centralized service system an action, to generate controls, to alert and turn one or more of the receiving resources remotely and to accomplish this present invention can utilize more than one communication linkage that can be alternatively used.

There are no similar communications systems in the prior art, to the best of Applicant's knowledge.

III. SUMMARY OF THE INVENTION

It is one of the main objects of the present invention to provide a system for conveying signals from one transmitting centralized service system to a receiving client to activate at least one of the receiving client's electronically controllable resources.

It is another object of this invention to provide a system that uses alternative communication linkages for conveying the signals improving the successful hits probabilities to the desired destinations.

It is yet another object of this invention to provide such a device that is inexpensive to manufacture and maintain while retaining its effectiveness.

Further objects of the invention will be brought out in the following part of the specification, wherein detailed description is for the purpose of fully disclosing the invention without placing limitations thereon.

IV. BRIEF DESCRIPTION OF THE DRAWINGS

With the above and other related objects in view, the invention consists in the details of construction and combination of parts as will be more fully understood from the following description, when read in conjunction with the accompanying drawings in which.

V. DETAILED DESCRIPTION OF THE PREFERRED EMBODIMENT

Figure 1:
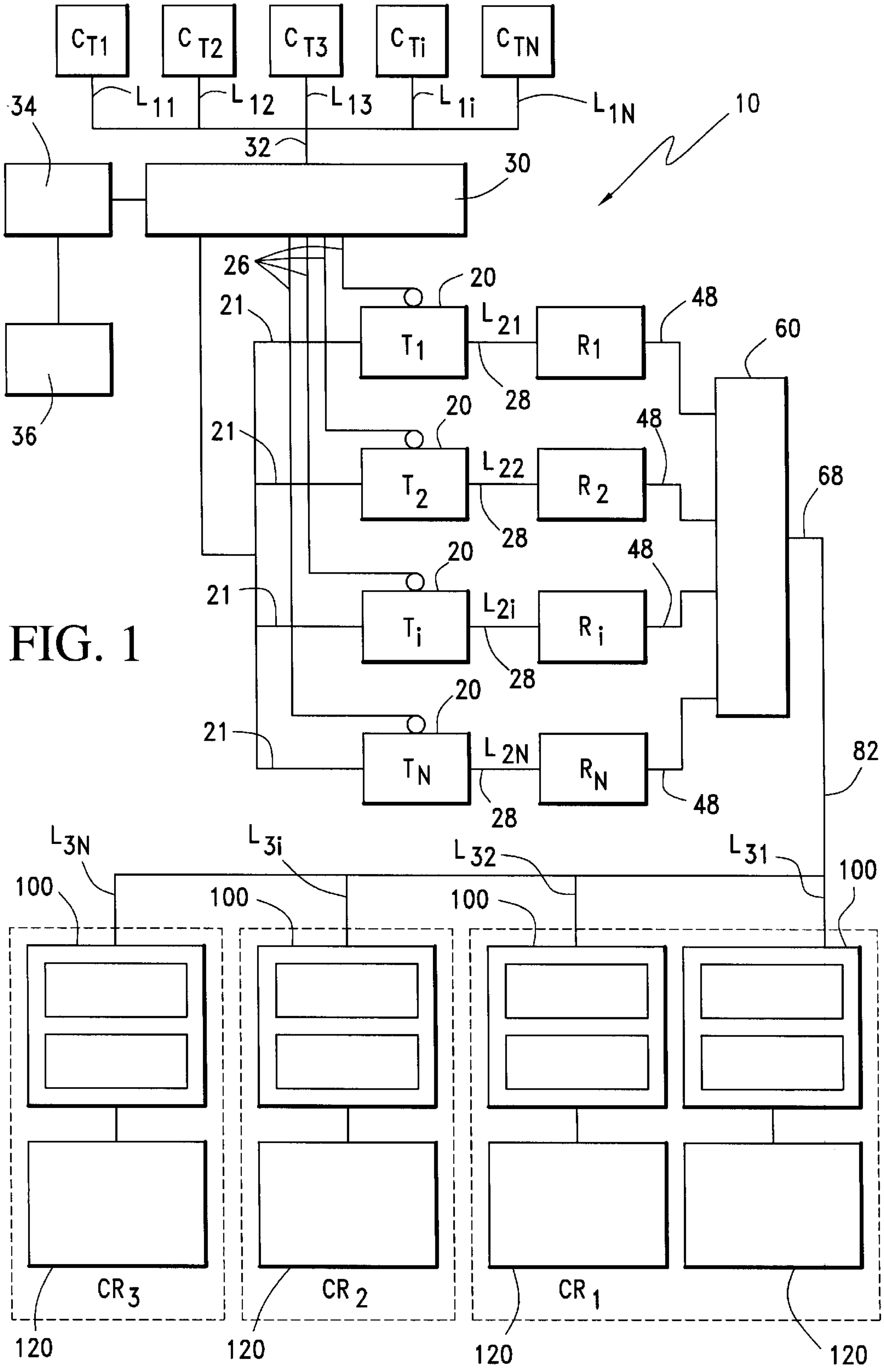
FIG. 1 represents a block diagram with subscribed transmitting clients connected to a system that uses one of several communication linkages to convey the signals for controlling the controllable resources of receiving clients.
Figure 2:
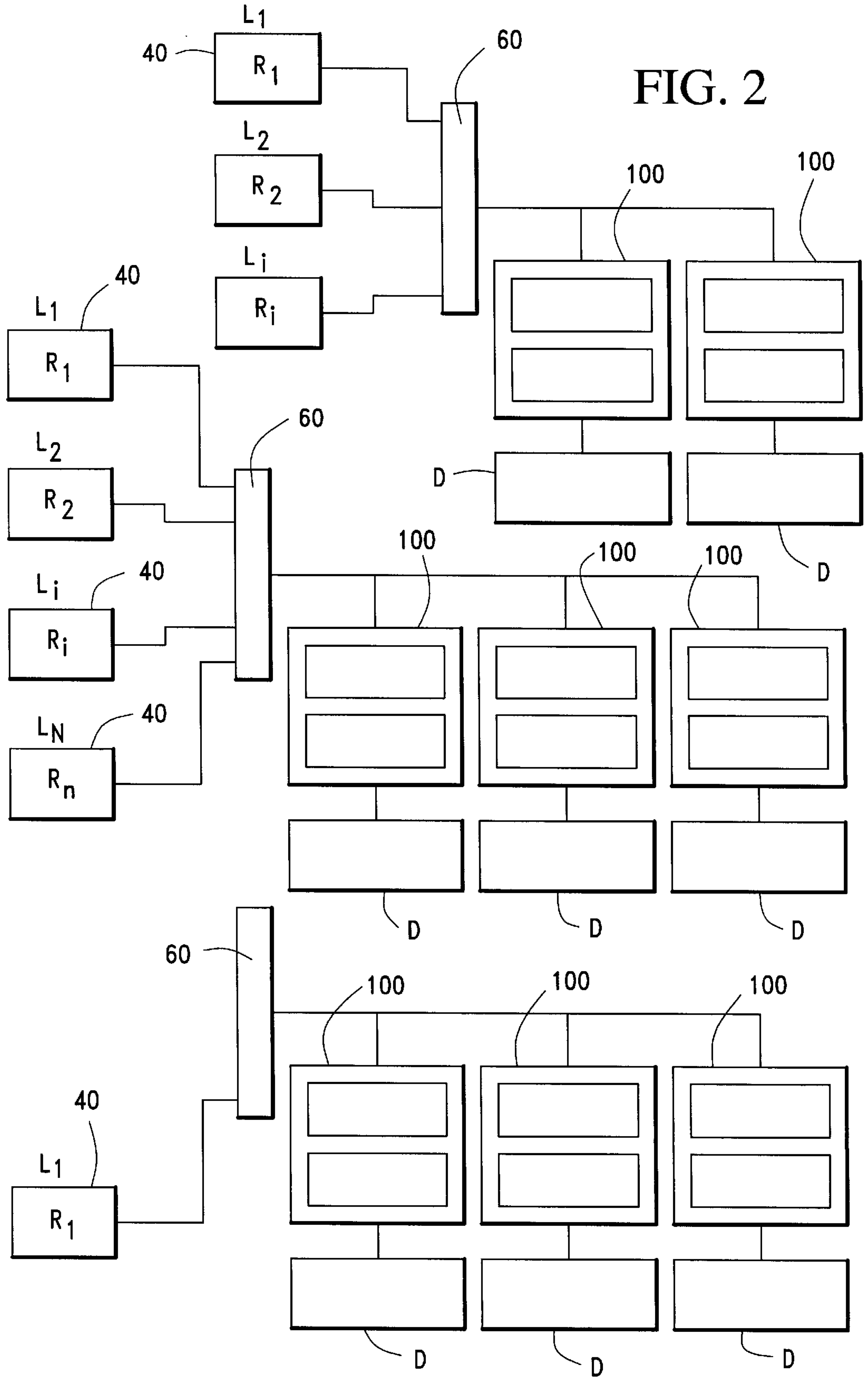
FIG. 2 shows a block diagram that includes several sets of receivers over a wide area network responding to only one set of transmitters.

Referring now to the drawings, where the present invention is generally referred to with numeral 10, it can be observed that it basically includes a set of transmitting clients ($C_{t1}$, $C_{t2}$, . . . $C_{ti}$, $C_{tn}$) subscribed to the system with another set of subscribed receiving clients ($C_{r1}$, $C_{r2}$. . . $C_{ri}$, $C_{rn}$) typically remotely located, and with whom the former can selectively communicate regardless of the communications links used. Several transmitting assemblies 20 are connected through second communication links to a corresponding number of receiving assemblies 40. The transmitting assemblies 20 have each a first signal input 21, a second signal input 26 and a transmitting assembly output 28. The first signal input 21 includes control (and may also include data depending on bandwidth limitations) information. The first signal inputs 21 are commonly connected. The second signal inputs receive an enable signal that selectively makes one of the transmitting assemblies 20 ($T_1$, $T_2$, . . . $T_i$, $T_n$) active. The first signal is generated by signal generator center assembly 30 that in turn is connected to a number of transmitting clients ($C_{T1}$, $C_{T2}$, $C_{Ti}$, $C_{Tn}$) through first local links 32. Remotely from the transmitting assemblies 20 ($T_1$, $T_2$, . . . $T_i$, $T_n$) there are different sets of receiving assemblies 40 ($R_1$, $R_2$, . . . $R_i$, $R_n$) having each an input connected through cooperating second communication links with transmitting assembly outputs 28. Each one of the receiving assemblies 40 are enabled at all times and include receiving assemblies outputs 48. All outputs 48 of receiving assemblies 40 are connected to selector unit assembly 60 whose function is to detect the presence of signals, enable the signals through, block signals present at outputs 48 except for one that is enabled through. The enabled output 48, after being processed by selector unit assembly 60, produces output 68. Output 68 includes the information contained in the first signal plus additional information about the subscribed receiver's resources and characteristics of the receiving network links.

Output 68 is delivered to one of several predetermined communications networks to which subscribing clients ($C_{R1}$, $C_{R2}$. . . $C_{Ri}$, $C_{Rn}$) are connected through actuating devices 100. Actuating devices in turn control subscribers' resources 120. Examples of subscriber's resources 120 are: pagers, telephones, computers with modems connected to the public telephone network and/or internet, etc. As shown in FIG. 1, $C_{R1}$ includes two control subscriber's resources 120.

Transmitting clients are represented in FIG. 1 with letters $C_{T1}$, $CT_2$, . . . $C_{Ti}$, $C_{Tn}$. Each of these transmitting clients are connected to signal generator or signal processor assembly 30 and transmit an encoded request signal that includes the identity of the transmitting client, the intended recipient and a predetermined amount control and/or data. This is accomplished through first communications links ($L_{11}$; $L_{12}$; . . . $L_{1i}$; $L_{in}$). In one of the preferred embodiments, this first communication link network 32 is implemented with the public telephone network even though other communication means can also be used such as internet, radio waves, etc. Once the signal is received by signal or processor assembly 30, it is decoded and two signals are generated. The first signal 25 basically includes the same information that was conveyed by a transmitting client $C_{Ti}$ and second signal 26 enables one of several transmitters ($T_1$, $T_2$. . . $T_i$, $T_n$). The inputs 21 of the transmitters ($T_1$, $T_2$. . . $T_i$, $T_n$) are commonly connected. Assembly 30 includes computerized circuitry 34 with memory storage 36 with adequate instructions to match a particular transmitter ($T_1$, $T_2$. . . $T_i$, $T_n$) with a given recipient depending on the second communication links ($L_{21}$; $L_{22}$. . . $L_{2i}$; $L_{2n}$) that are available in the area where the recipient is located. In the event that one of these links is disabled, an alternate link is selected. In the preferred embodiment, one of these second communication links is an internet connection capable of transmitting the first signal worldwide inexpensively. Another second communication link may be the public telephone network, a radio link, a dedicated microwave line, or any other telecommunication means.

Since the subscribed recipients may be located in remote areas, a number of sets of receivers ($R_1$, $R_2$, . . . $R_i$, $R_n$) are remotely located from transmitters ($T_1$, $T_2$. . . $T_i$, $T_n$) to which they are connected through the above referenced second communication links. Receivers ($R_1$, $R_2$. . . $R_i$, $R_n$) are always enabled and ready to receive. Selector unit assembly 60 senses which of the outputs of receivers ($R_1$, $R_2$. . . $R_i$, $R_n$) is active and through an output in selector unit assembly 60 directs the coded first signal to the pertinent subscribing recipient ($C_{R1}$, $C_{R2}$, . . . $C_{Ri}$, $C_{Rn}$) through a third communications link ($L_{31}$; $L_{32}$; . . . $L_{3i}$, $L_{3n}$). In the preferred embodiment, the third communications links are implemented with a wired or paging communications network 82 since they are very inexpensive and popular technology. Each subscribed recipient ($C_{R1}$, $C_{R2}$, . . . $C_{Ri}$, $C_{Rn}$) has an actuator device 100 connected to the above mentioned receivers through the third communication link ($L_{31}$, $L_{32}$, . . . $L_{3i}$, $L_{3n}$). Actuating devices 100 are capable of controlling (at least turning on and off) one or more resource devices at the premises of the subscribed recipient ($C_{R1}$, $C_{R2}$, . . . $C_{Ri}$, $C_{Rn}$).

The present invention permits the activation of the resources of subscribing clients from a control center through at least one communications network. At least one network is available, at a time, from several different redundant alternative networks. The user's resources are thus activated through conventional heterogeneous networks available at present. A user then is maintained in permanent alert state for receiving information through different possible unknown sources with different formats in accordance with each subscribers' own resources.

In this manner, a transmitting client will be able to alert or prepare a recipient client prior to the transmission of his or her message through a conventional communications resource and it will assured that the receiving resource device is going to be ready for the reception. The transmitting user will divorce himself or herself from the means utilized to reach the recipient to convey the message. Depending on the bandwidth availability, in addition to control signals, data can be transmitted to the actuating devices which will convey it to the resource receiving device. If there is only one receiver, selector unit assembly 60 is not necessary The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. An electronic signal communication system for processing remote signals comprising:

A) signal processing means for generating a first signal and creating a second signal from the data included in said first signal;

B) a plurality of communication transmitting means each having first and second inputs, said first inputs being commonly connected for receiving said first signal and said second inputs being adapted to receive said second signal so that only one of said communication transmitting means is enabled at one time, and further including a first output for each of said communication transmitting means;

C) at least one communication receiving means each having a receiving input compatible with at least one of said first outputs through respective first communication links, and each of said communication receiving means including a second output;

D) means for detecting and selecting the active second output of one of said communication receiving means and including third output means wherein a third signal produced that includes predetermined data; and E) a plurality of receiving clients communication means addressed through respective second communication links in response to the data of said first signal present at said third output means.

2. The system set forth in claim 1, further including:

F) a plurality of transmitting clients' communication means for generating said first signal including control and data and being connected to said signal processing means.

3. The system set forth in claim 2, wherein said signal processing means includes computer means for storing instructions and data to perform pre-programmed steps to determine the characteristics of said second signal.

4. The system set forth in claim 3 further including:

G) at least one slave actuating means for each of said receiving client's communication means, having each at least one slave actuating means having an actuating input commonly connected to said third output means, and having an actuating output, said slave actuating means being designed to be activated in response to receiving said third signal.

5. The system set forth in claim 4 wherein said first signal is coded with a destination activator's address and there are at least two slave actuating means each having means for detecting said coded first signal and responding to a unique code assigned to each of said slave actuating means.

* * * * *